United States Patent

Maki

[11] Patent Number: 5,914,629
[45] Date of Patent: Jun. 22, 1999

[54] TEMPERATURE SENSING DEVICE, SEMICONDUCTOR DEVICE HAVING TEMPERATURE SENSING DEVICE INSTALLED THEREIN AND AUTO-FOCUSING SYSTEM USING THIS SEMICONDUCTOR DEVICE

[75] Inventor: Yasuhito Maki, Kanagawa, Japan

[73] Assignee: Sony Corporation, Japan

[21] Appl. No.: 08/743,307

[22] Filed: Nov. 5, 1996

[30] Foreign Application Priority Data

Nov. 10, 1995 [JP] Japan ................................ P07-292527

[51] Int. Cl.⁶ .................................................. H01L 35/00
[52] U.S. Cl. ............................ 327/512; 327/513; 327/87; 374/178
[58] Field of Search .................... 327/512, 513, 327/83, 378, 63, 66, 78, 79, 87, 88, 89; 374/178

[56] References Cited

U.S. PATENT DOCUMENTS

| | | | |
|---|---|---|---|
| 3,619,659 | 11/1971 | Meyer et al. ............................ | 307/263 |
| 3,742,262 | 6/1973 | Ichinohe et al. ........................ | 307/310 |
| 3,760,195 | 9/1973 | Szpakowski ............................ | 307/235 |
| 3,814,957 | 6/1974 | Way ....................................... | 307/310 |
| 3,935,478 | 1/1976 | Okada et al. ............................ | 307/229 |
| 4,004,462 | 1/1977 | Dobkin ................................. | 73/362 R |
| 4,184,126 | 1/1980 | Jaskolski et al. ......................... | 331/66 |
| 4,336,467 | 6/1982 | Lisco ..................................... | 307/350 |
| 4,448,549 | 5/1984 | Hashimoto et al. ..................... | 374/170 |
| 4,456,390 | 6/1984 | Junker et al. ............................ | 374/128 |
| 4,525,637 | 6/1985 | Sano et al. .............................. | 307/350 |
| 5,149,199 | 9/1992 | Kinoshita et al. ....................... | 374/178 |
| 5,175,451 | 12/1992 | Ihara ...................................... | 307/530 |
| 5,291,607 | 3/1994 | Ristic et al. ............................ | 395/750 |
| 5,412,448 | 5/1995 | Kunishige ............................... | 354/400 |
| 5,446,397 | 8/1995 | Yotsuyanagi ............................ | 327/66 |
| 5,477,170 | 12/1995 | Yotsuyanagi ............................ | 327/66 |
| 5,488,368 | 1/1996 | Brown et al. ........................... | 341/119 |

FOREIGN PATENT DOCUMENTS

| | | |
|---|---|---|
| 0531615 A2 | 3/1993 | European Pat. Off. . |
| 3831012 | 3/1990 | Germany . |
| WO 94/28383 | 12/1994 | WIPO . |

OTHER PUBLICATIONS

N. Manaresi et al.; "Mosfet Threshold Extraction Circuit" Electronics Letters, vol. 31, No. 17, Aug. 17, 1995 pp. 1434–1435.

*Primary Examiner*—Timothy P. Callahan
*Assistant Examiner*—An T. Luu
*Attorney, Agent, or Firm*—Rader, Fishman & Grauer; Ronald P. Kananen

[57] ABSTRACT

In view of the fact as found in the prior art that a measured device as hardly installed on a chip and a temperature variation in the measured device could not be detected accurately, the present invention provides a system in which a MOS transistor is arranged, there is provided a potential control circuit for sensing a potential in the case of depletion under a gate of a certain specified MOS transistor and controlling a gate voltage of the MOS transistor while comparing the detected output with the reference voltage Vref, and a temperature is detected in reference to a variation in current of the MOS transistor while controlling a gate voltage of the MOS transistor by this potential control circuit.

16 Claims, 10 Drawing Sheets

F I G. 5
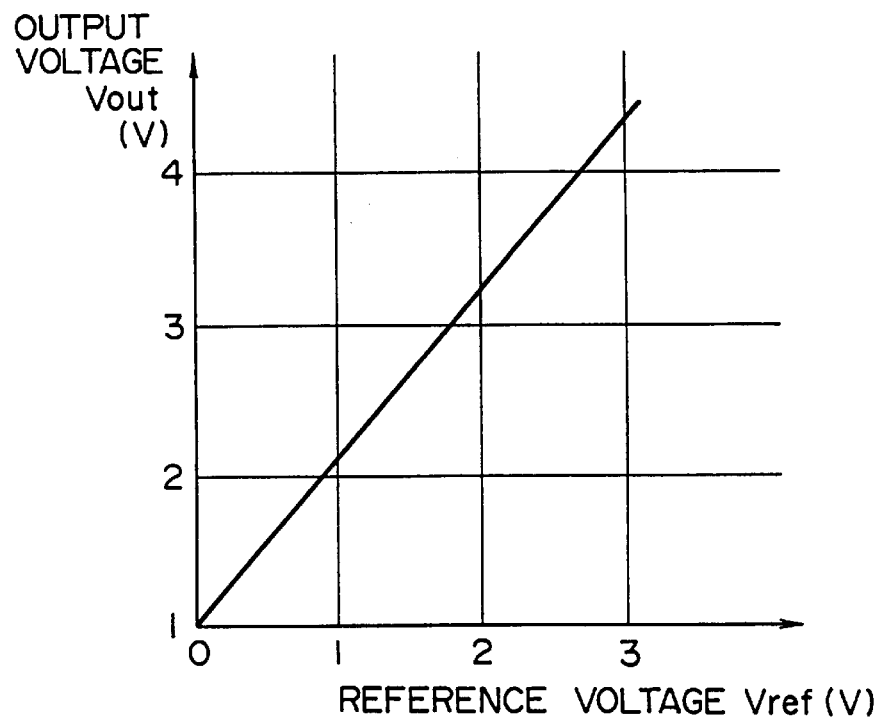
F I G. 6
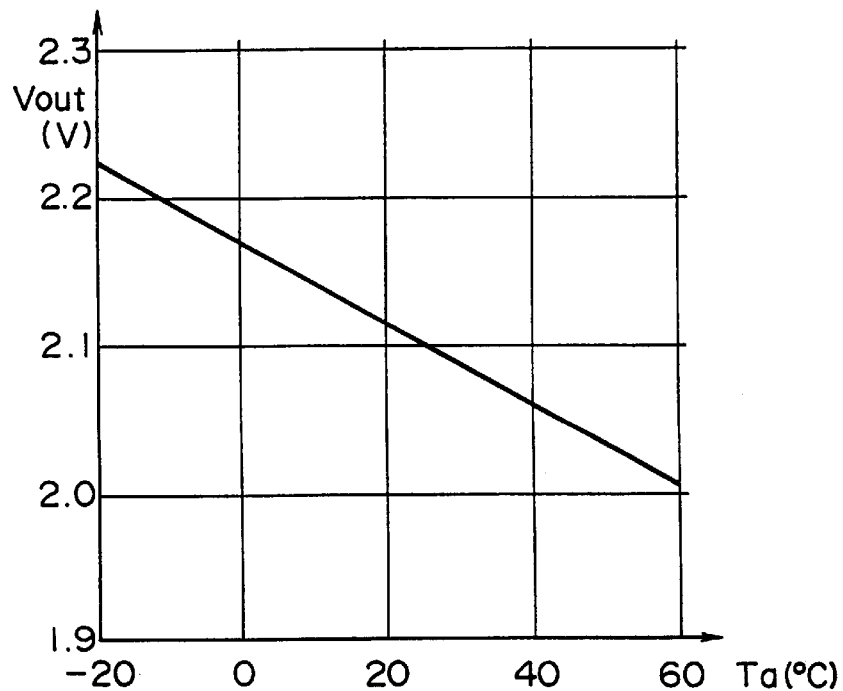

TEMPERATURE SENSING DEVICE, SEMICONDUCTOR DEVICE HAVING TEMPERATURE SENSING DEVICE INSTALLED THEREIN AND AUTO-FOCUSING SYSTEM USING THIS SEMICONDUCTOR DEVICE

BACKGROUND OF THE INVENTION

1. Field of the Invention

This invention relates to a temperature sensing device, a semiconductor device having this temperature sensing device installed therein and an auto-focusing (AF) system using this semiconductor device.

2. Description of Related Art

As one of the applications of a solid-state imaging device, for example, a CCD (Charge Coupled Device) linear sensor, there is provided an auto-focusing sensor (hereinafter called as an AF sensor). In a simple AF sensor, a so-called triangle measuring system is applied for calculating a distance. That is, as shown in FIG. 11, there are provided two lenses 101, 102 spaced apart by a specified distance L and further there are arranged two CCD linear sensors 103, 104 spaced apart by a specified distance (d) in respect to each of these lenses 101, 102.

Then, distances X1, X2 ranging from each of the center points of the lenses 101, 102 to each of image focusing points P1, P2 are calculated in response to each of output signals when an object P is focused on the two CCD linear sensors 103, 104 through the lenses 101, 102, and then a position of each of the lenses 101, 102 in their optical axial directions is automatically controlled so as to satisfy an equation 1 below.

$$D = d \times \{L/(X1+X2)\} \qquad \text{Equ. 1}$$

In the aforesaid AF sensor, it is generally applied that a plastic lens is normally used as this type of lens in order to make a low cost assembly. However, in recent years, there has been found a tendency that a CCD sensor with a multi-pixel high density characteristic is used in order to manufacture a high precision AF sensor and in this case, an error caused by a variation in strain (aberration) caused by a temperature in an optical system of such a lens as above to be used and the like can not be ignored, resulting in that the error is required to be corrected. Due to this fact, it becomes necessary to provide a temperature sensing device for use in sensing a variation in temperature. In that case, it is advantageous to install the temperature sensing device on a CCD chip in view of its cost and space and the installation on the chip enables a temperature of the AF sensor by itself to be measured accurately, so that its correcting accuracy may also be improved.

As shown in FIG. 12A and FIG. 12B, it is well known to provide this type of temperature sensing device in which a normal electrical current is flowed in a pn-junction diode and a variation of voltage value of a forward direction on-voltage (a turn-on voltage) is utilized. With such an arrangement as above, although a voltage value of the forward direction on-voltage of the pn-junction diode indicates a junction voltage value of about 0.7 V at a normal temperature, this junction voltage value is reduced if the temperature is increased under the same condition (for example, the electrical current is the same) as that of the measurement at the normal temperature in the case of silicon Si. Actually, this variation is about −2 mV/°C. per one piece of diode, so that it is necessary to connect a plurality of stages of diodes (two stages in this example) as shown in FIG. 13A and FIG. 13B or to connect an amplifying circuit having a less dependency of temperature on an amplification rate to a stage subsequent to the former stages in order to attain a high precision sensing of the temperature.

In addition, it is also well known as another temperature sensing device to utilize variation in voltage value of a base-emitter junction voltage $V_{BE}$ of a bipolar transistor caused by the temperature. However, since the temperature sensing device using the pn-junction diode or the bipolar transistor is naturally realized by a bipolar process, it is difficult to install this device on a CCD linear sensor in view of its manufacturing process. Even if the diode could be installed on a chip, it would be difficult to install a high precision amplifying circuit on the chip.

Further, although it is widely known to perform a temperature sensing with a thermistor, it is necessary to install it on the chip in order to perform an accurate measurement of a measured device. In such a case as one in which the installation on the chip is required, it may not be realized with a thermistor (an element normally called as a thermistor). In view of such reasons as described above, it is desired to develop a temperature sensing device which can be realized by a so-called MOS process.

SUMMARY OF THE INVENTION

The present invention has been developed in view of the aforesaid problem and it is an object of the present invention to provide a temperature sensing device in which a measured item can be installed on a chip and a temperature variation of the measured device can be detected accurately, a semiconductor device having this temperature sensing device installed therein and an AF system using the semiconductor device.

The temperature sensing device of the present invention is constructed to have a potential control circuit having a first MOS transistor, sensing a potential under a depletion in a gate of the first MOS transistor and controlling a gate voltage of the first MOS transistor, and a second MOS transistor of which gate voltage is controlled by the potential control circuit and of which output is applied as a temperature output.

The potential control circuit in the temperature sensing device having the aforesaid configuration detects a potential in the case of depletion in the gate of the first MOS transistor stored therein and controls a gate voltage of the first MOS transistor, thereby sets the potential equal to a reference voltage or a potential proportional to the reference voltage. An output of this potential control circuit is applied as the gate voltage of the second MOS transistor, thereby controls a temperature dependency of a threshold voltage Vth of the MOS transistor. Then, only the temperature dependency of a drain current Ids of the MOS transistor is utilized to detect a temperature.

The semiconductor device of the present invention is constructed such that the temperature sensing device having the aforesaid configuration is installed on the same chip. In addition, the AF system of the present invention is constructed such that a solid-state imaging device installed on the same chip is used as an AF sensor.

BRIEF DESCRIPTION OF THE DRAWINGS

FIG. 5 is an input/output characteristic diagram in a potential control circuit.

FIG. 6 is a temperature characteristic diagram in a potential control circuit.

DESCRIPTION OF THE PREFERRED EMBODIMENT

Referring now to the accompanying drawings, one preferred embodiment of the present invention will be described in detail as follows.

Figure 1:
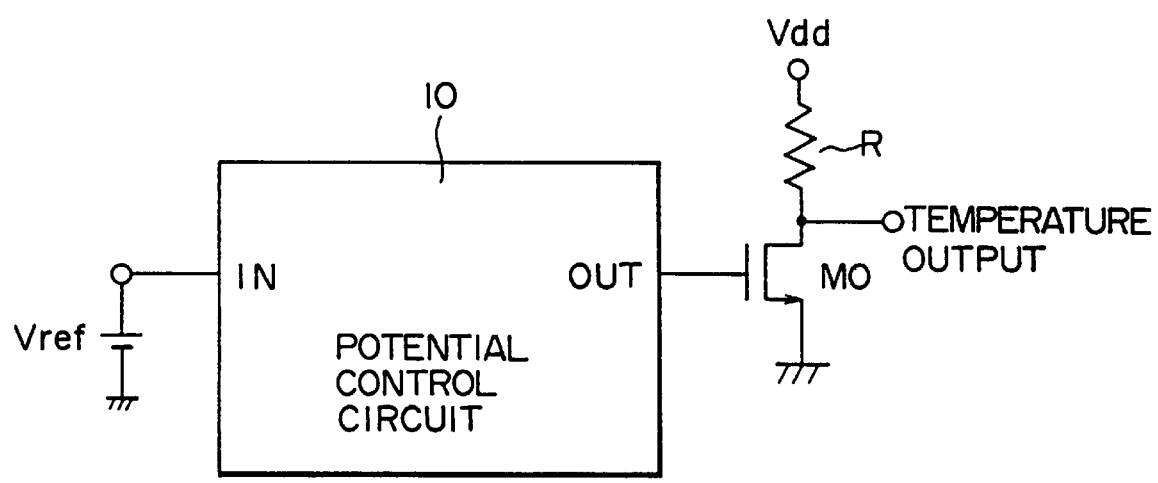
FIG. 1 is a con figuration figure for showing one preferred embodiment X the present invention.

FIG. 1 is a configuration view for showing one preferred embodiment of the present invention. In FIG. 1, the temperature sensing device of the preferred embodiment of the present invention is comprised of at least one MOS transistor M0 with its source being connected to the ground and its drain being connected to a power supply Vdd through a reference resistor R, and a potential control circuit 10 operated to make a potential in case of depletion under a gate of this MOS transistor M0 equal to the reference voltage Vref or a potential proportional to the reference voltage Vref. That is, MOS process is carried out so as to take out an output which is dependent upon a temperature.

In this case, as parameters of the MOS transistor which are dependent upon a temperature, there are provided a threshold voltage value Vth and a drain current Ids. Of these parameters, a configuration utilizing a temperature variation of the drain current Ids in the preferred embodiment is employed. In the case that the drain current Ids is used as a parameter which is dependent upon a temperature, its output can be remarkably increased by changing a size of the MOS transistor M0. For example, mere setting of twice of a channel width causes the current to become twice in its value. This variation in current can be attained as a voltage output through the reference resistor R and this voltage output becomes a temperature output.

This drain current Ids is expressed by Equation 2 during an operation in a saturated region.

$$Ids = \frac{\mu \cdot \varepsilon_{0X} \cdot \varepsilon_0 \cdot W}{t_{0X} \cdot L} \cdot (Vgs - Vth)^2 / 2 \quad \text{Equation 2}$$

where, $\mu$ is an electron moving degree, $\varepsilon OX$ is a dielectric constant, $\varepsilon_0$. is a vacuum dielectric constant ($8.85 \times 10^{-12}$ ($F \cdot m^{-1}$)), $t_{0X}$ is a film thickness of a gate oxidizing film, W is a channel width, L is a channel length and Vgs is a gate voltage.

However, in accordance with the above equation, an electron moving degree $\mu$ is decreased as a temperature is increased near a normal temperature so as to cause the drain current Ids to be decreased, although a threshold voltage Vth is decreased in its value by itself, its negative may act to cause the drain current Ids to be increased. In view of this fact, in the preferred embodiment of the present invention, the potential control circuit 10 is applied to cause a potential in the case of a depletion in a gate of the MOS transistor M0 (=Vgs-Vth) to be kept constant, thereby the drain current Ids is set to have a temperature dependency only on an electron moving degree $\mu$.

The potential control circuit 10 is a circuit for controlling a gate voltage of the MOS transistor M0 in such a way that even if the power supply voltage Vdd or the threshold value voltage Vth varies, the potential in the case of depletion under the gate of the MOS transistor M0 may become the reference voltage Vref. A practical circuit configuration of this potential control circuit 10 will be described as follows.

Figure 2:
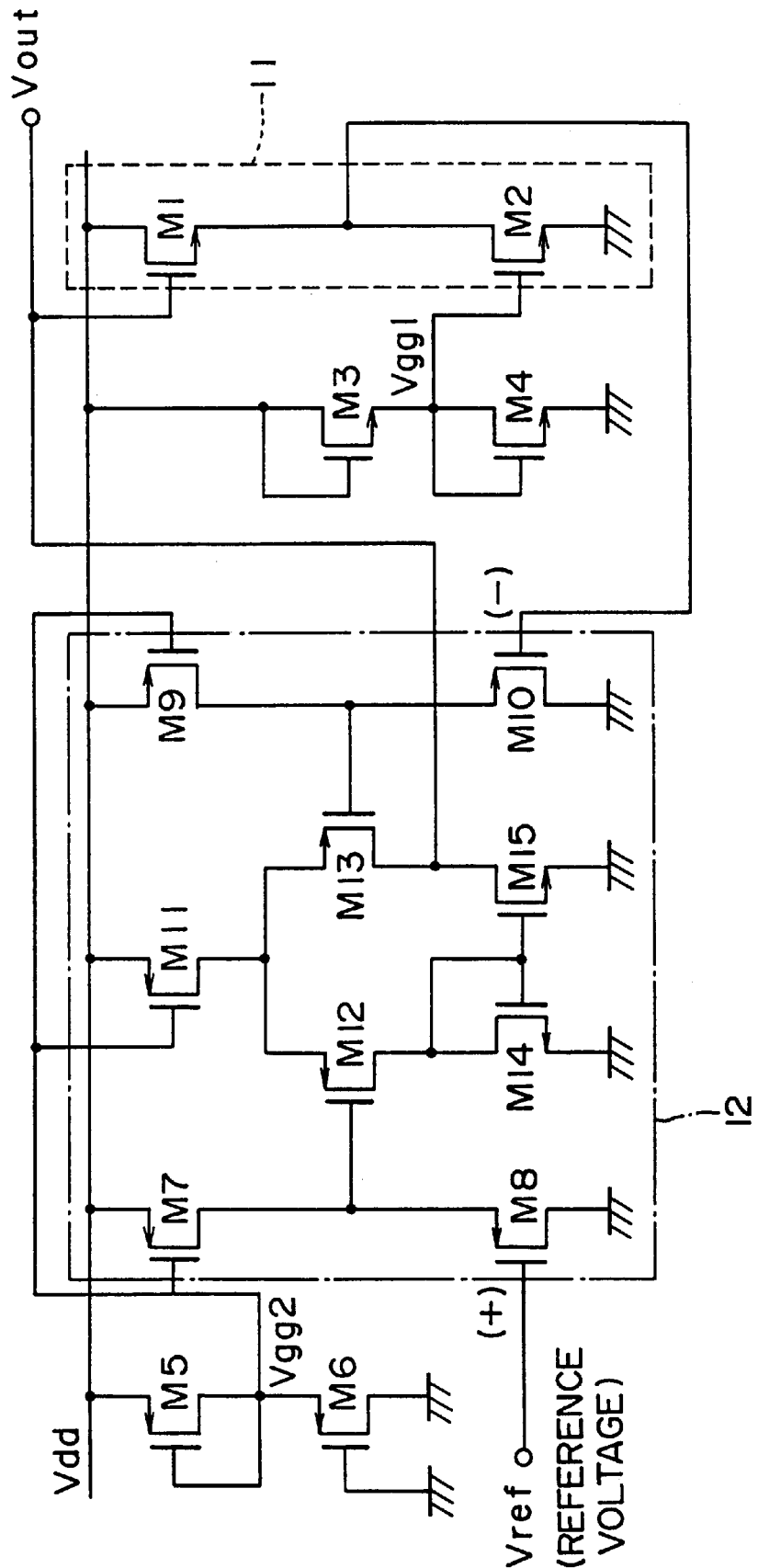
FIG. 2 is a circuit diagram of one example of a potential control circuit in the case that an NMOS transistor is used.

FIG. 2 is a circuit diagram of one example of the potential control circuit in the case that an NMOS transistor is applied. In FIG. 2, a potential-voltage conversion circuit 11 is comprised of a driving side MOS transistor M1 and a load side MOS transistor M2 connected in series between the power supply Vdd and the ground, and a bias voltage Vgg1 is applied to a gate of the load side MOS transistor M2 by the MOS transistors M3, M4 connected with diode connected in series between the power supply Vdd and the ground.

An output of this potential-voltage conversion circuit 11 becomes an inverted (−) input of a comparator 12 and this is compared with a reference voltage Vin which becomes its non-inverting (+) input. To this comparator 12 is applied a bias voltage Vgg2 by MOS transistors M5, M6 connected by diode connected in series between the power supply Vdd and the ground.

The comparator 12 is comprised of MOS transistors M7, M8 connected in series between the power supply Vdd and the ground so as to constitute a (+) side input; the MOS transistors M9, M10 constituting a (−) side input stage; the MOS transistors M12, M13 having their sources connected in common to perform a differential operation; the MOS transistor M11 becoming a current source for the former MOS transistors; and the MOS transistors M14, M15 connected between each of the drains of the MOS transistors M12, M13 and the ground so as to constitute a current mirror circuit, wherein a bias voltage Vgg2 is applied to each of the gates of the MOS transistors M7, M9 and M11, respectively.

Figure 3:
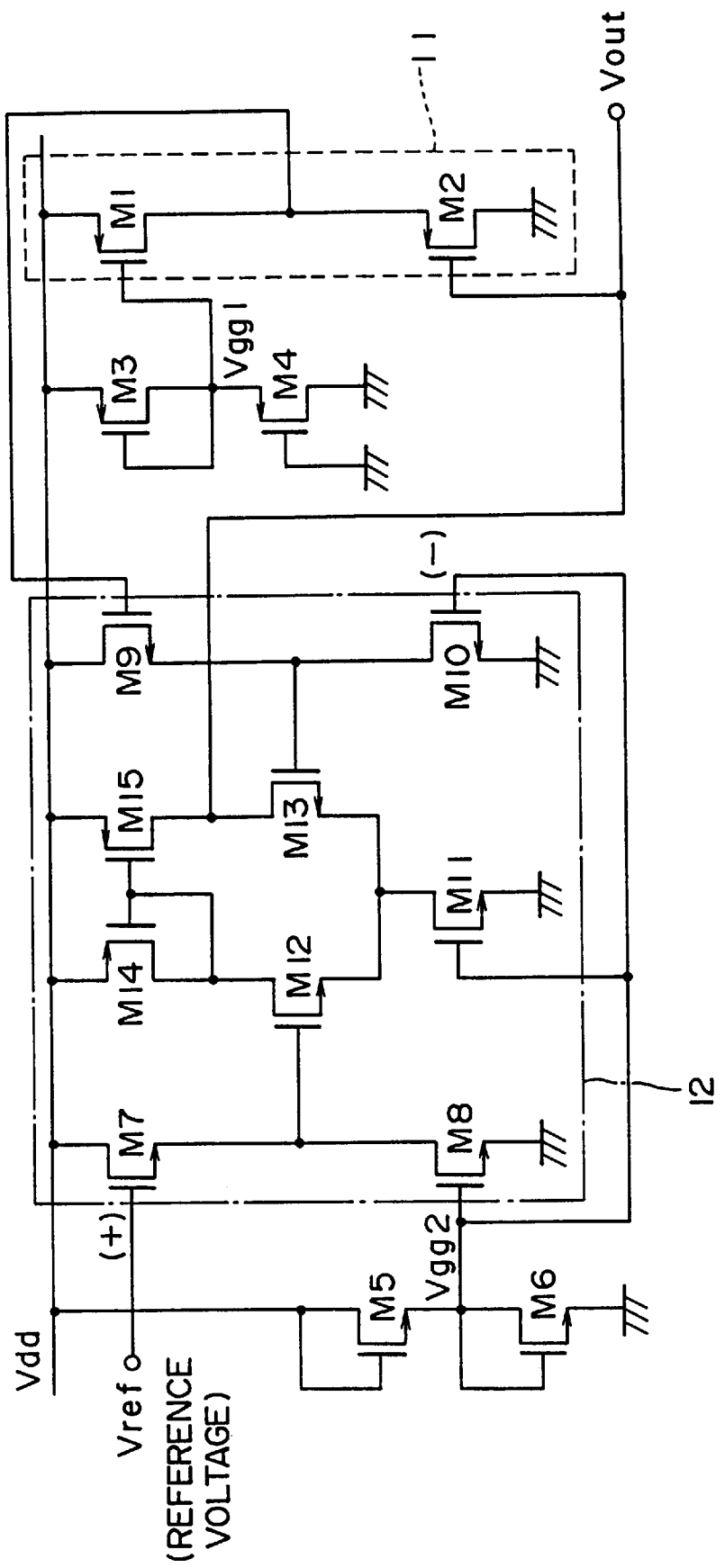
FIG. 3 is a circuit diagram of one example of a potential control circuit in the case that a PMOS transistor is used.

FIG. 3 is a circuit diagram for showing one example of the circuit configuration of the potential control circuit 10 in the case that the PMOS transistor is applied. This potential control circuit 10 is merely different from the potential control circuit shown in FIG. 2 in view of the fact that its polarity is reverse to that of the latter one and basically both of them are of the same circuit configuration.

Figure 4A:
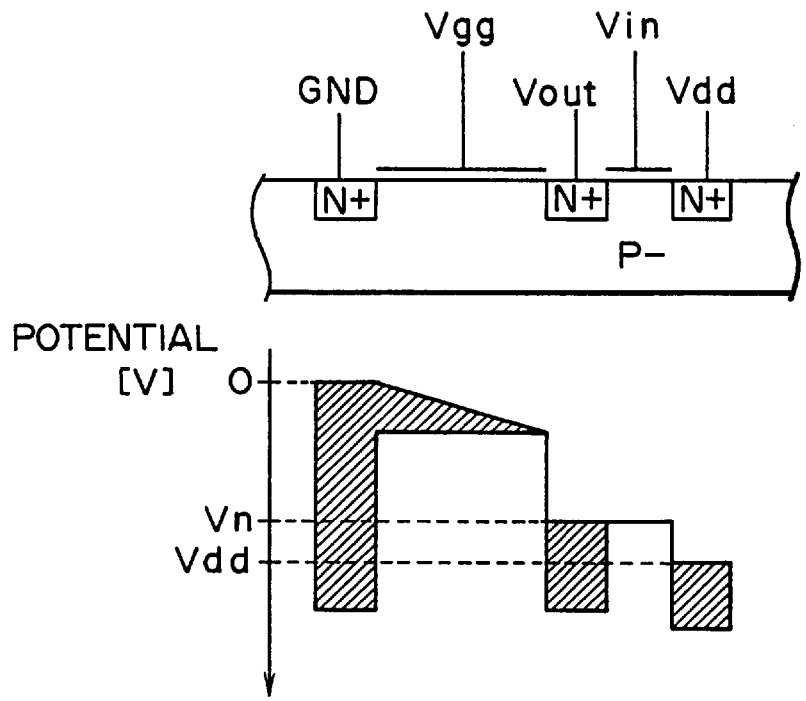
FIGS. 4A and 4B are sectional views and potential diagrams for showing portions in the MOS transistors M1, M2 in a potential-voltage conversion circuit, respectively.
Figure 4B:
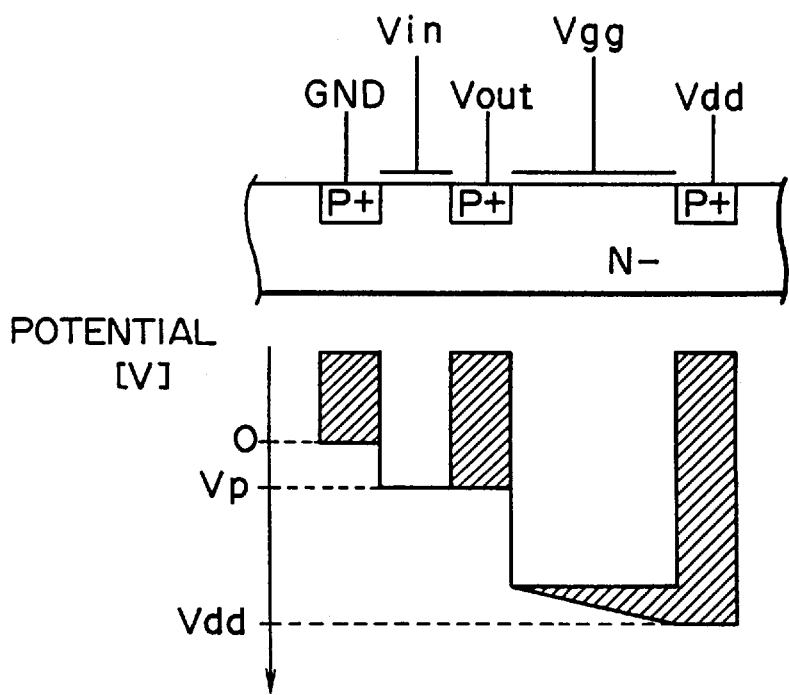

In FIG. 4A and FIG. 4B are shown a sectional view and a potential diagram of the portions of the MOS transistors M1, M2 in the potential-voltage conversion circuit 11. In this case, the potential-voltage conversion circuit 11 applied with NMOS will be described as follows. In the case that the channel width of each of the MOS transistors M1, M2 is W1, W2, respectively, and the channel length is defined as L1, L2, respectively, it is assumed that L1 is set to be low and L2 is set to be high. As one example, it is set to be L2/L1=approximately 100.

With such an arrangement as above, a fine current is flowed in the load side MOS transistor M2 and along with this flowing operation, a current flowing in the driving side MOS transistor M1 becomes a fine current, resulting in that a potential Vn in a channel under the gate of the MOS transistor M1 becomes an output voltage Vout as it is. That is, a size ratio as described above is set to enable a potential in the case of depletion under a gate of the MOS transistor M1 to be detected as an output voltage Vout.

In the potential control circuit 10 having the aforesaid configuration, the potential-voltage conversion circuit 11 may detect a potential in the case of depletion under a gate of the MOS transistor M1 in view of the aforesaid principle. The output of this potential-voltage conversion circuit 11 is compared with the reference voltage Vref at the comparator 12 and a gate voltage of the MOS transistor M1 in the potential-voltage conversion circuit 11 is controlled by the output of comparison. With such an arrangement as above, the potential in the case of depletion under a gate of the MOS transistor M1 is feed back controlled in such a way that it may be equal to the reference voltage Vref.

Then, the output voltage Vout of this potential control circuit 10 is given to the MOS transistor M0 as its gate voltage. In this case, as the MOS transistor M0, the transistor having the same size as that of the MOS transistor M1 in the potential-voltage conversion circuit 11 is applied and the potential in the case of depletion under a gate of the MOS transistor M0 is also controlled by the potential control circuit 10 in such a way that it may be equal to the reference voltage Vref.

The potential under a gate, in the case of depletion, of the MOS transistor M0 is kept at a specified voltage (the reference voltage Vref) even if either the power supply Vdd or the threshold value voltage Vth is varied, resulting in that the drain current Ids has a single temperature dependency of the electron moving degree $\mu$. Accordingly, when the temperature is changed, the drain current Ids in the MOS transistor M0 is changed, and this current varying part is obtained as a voltage output through a reference resistor R to become a temperature output.

In FIG. 5 is indicated a characteristic of a reference voltage Vref to an output voltage Vout in the potential control circuit 10. This characteristic is an example of the case of Vth=1 V. A reason why its gradient is not 1 is dependent upon a back-gate effect or the like. In addition, in FIG. 6 is indicated a temperature characteristic (a reference voltage Vref being kept constant) in the potential control circuit 10. A gate voltage Vgs of the MOS transistor M0 is controlled by the potential control circuit 10, thereby as the temperature is increased, the gate voltage Vgs of the MOS transistor M0 follows a temperature variation of the threshold voltage Vth and is decreased, resulting in that a value (Vgs−Vth) in Equation 2 is kept constant.

Figure 7:
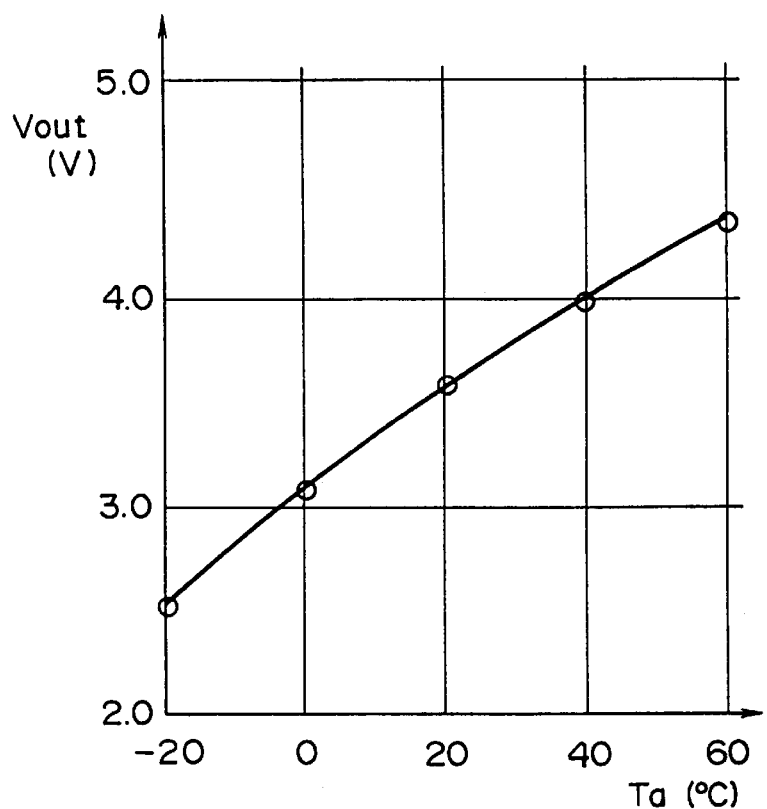
FIG. 7 is a temperature characteristic diagram for showing a result of simulation.

FIG. 7 is a temperature characteristic diagram indicating a result of actual simulation in the preferred embodiment. As apparent from this temperature characteristic diagram, it shows that a temperature coefficient is several tens mV/°C. and practically, a high precision circuit can be realized. If a dynamic range of the output is wide, several hundreds mV/°C. can also be realized.

Figure 8:
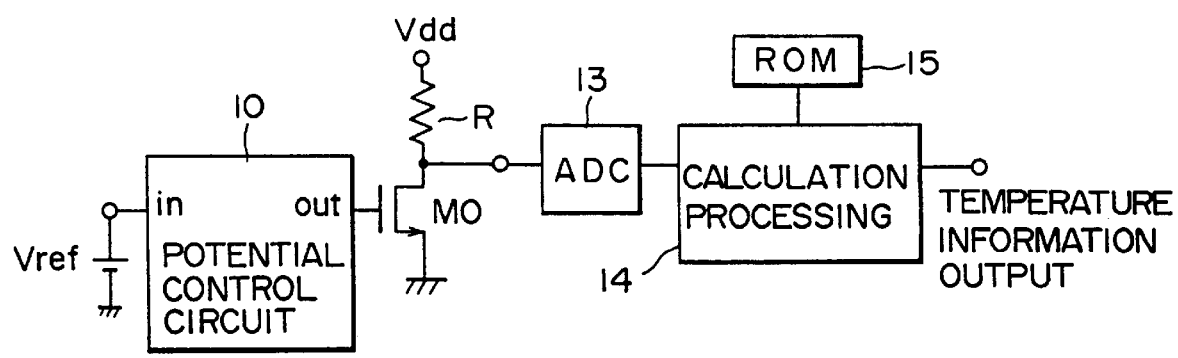
FIG. 8 is a configuration view for showing an entire temperature sensing device of the present invention.

In FIG. 8 is indicated a configuration figure of an entire temperature sensing device of the present invention. In FIG. 8, the temperature output detected as a voltage output through a reference resistor R is changed into a digital form by an AD converter 13 and supplied to a calculation processing circuit 14. Then, an actual temperature is calculated in this calculation processing circuit 14 in reference to the output data of the AD converter 13 by referring to a table of temperature coefficients and output voltages at a normal temperature stored in advance in ROM 15 and then this calculated temperature is applied as a temperature information output.

As described above, the MOS transistor M0 is used, a variation of the drain current Ids having a temperature dependency is detected through the reference resistor R while a potential in the case of depletion under a gate of this MOS transistor M0 is being controlled to become equal to the reference voltage Vref and the detected voltage output is applied as a temperature output, thereby the MOS transistor M0 performing actually the temperature sensing and the potential control circuit 10 can be installed on the chip of the measured device, resulting in that a variation of temperature of the measured device can be detected more accurately.

In addition, although a varying amount of current in the MOS transistor M0 is converted into a voltage through the resistor R and fed out as a temperature output in the preferred embodiment of the present invention, it is not necessarily required to take it out as a voltage output and it is also possible to output the current flowing in either the drain or source of the MOS transistor M0 and to apply it as a temperature output.

In addition, although a potential in the case of depletion under a gate of the MOS transistor M0 is controlled to become equal to a fixed reference voltage Vref in the aforesaid preferred embodiment, it is also possible to make the reference voltage Vref variable in response to a temperature and further to control the reference voltage Vref to be decreased as the temperature is increased. In such a controlling operation as above, it is possible to increase more a detecting sensitivity of a surrounding temperature.

Figure 9:
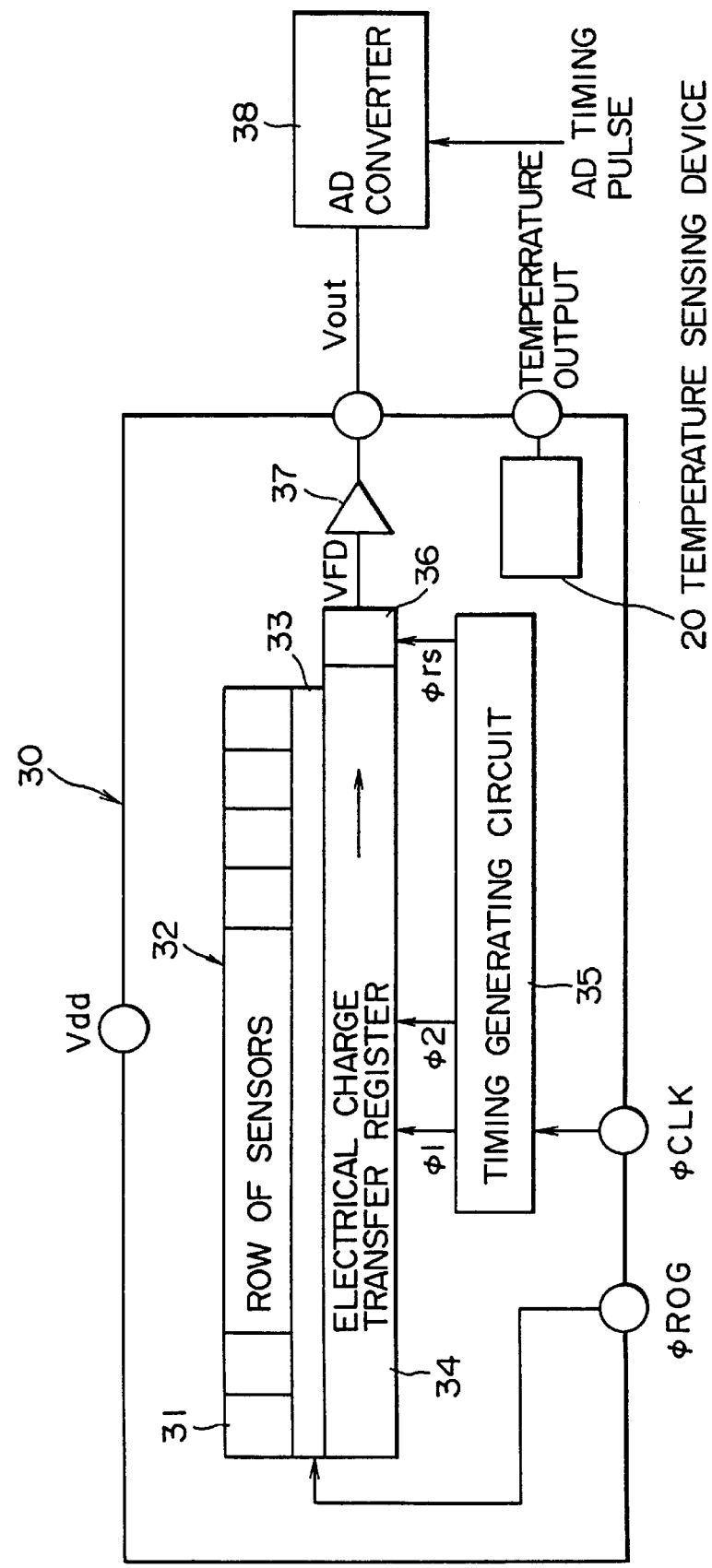
FIG. 9 is a configuration view for showing a CCD linear sensor having a temperature sensing device of the present invention installed therein.

FIG. 9 is a configuration figure for showing a CCD linear sensor, for example, having the temperature sensing device 20 of the present invention installed therein. In FIG. 9, a CCD linear sensor 30 is configured to have a row of linearly arranged sensors 32 in which a plurality of (for example, 2,000 pixels) photo-electrical conversion segments (pixels) 31 for converting an incident light into a signal charge of charged amount corresponding to its optical amount, and have a charge transfer register 34 for transferring a signal charge read out from each of the light receiving parts 31 in the row of sensors 32 through a reading-out gate 33.

With such a configuration as above, a reading-out operation for a signal charge through the reading-out gate part 33 is carried out by an operation in which a reading-out gate pulse φROG is given from an external side. In addition, the charge transfer register 34 is driven in two-phases by the transfer clocks φ1 and φ2. The two-phase transfer clocks φ1 and φ2 are generated at a timing generating circuit 35 having the CCD chip comprised of the row of sensors 32, the reading-out gate 33 and the charge transfer register 34 made thereon in reference to a reference clock φCLK given from the external side.

A terminal end of a transferring destination of the charge transfer register 34 is provided with a charge voltage converting part 36 comprised of a floating diffusion amplifier, for example, for detecting a signal charge transferred by the charge transfer register 34 and converting it into a voltage.

A rear stage of the charge voltage converting part 36 is provided with a buffer 37 comprised of a source follower circuit, for example. This buffer 37 is also made by being installed on the chip of the CCD chip in the same manner as that of the timing generating circuit 35. With such an arrangement as above, the CCD linear sensor 30 is configured and its output signal Vout is changed into a digital form by the AD converter 38 arranged outside the CCD chip.

In addition, a temperature sensing device 20 for use in sensing its surrounding temperature is installed in the chip of the CCD linear sensor 30. As this temperature sensing device 20, a device shown in FIG. 1, i.e. a temperature sensing device for outputting a temperature dependent output using the MOS process is applied. Applying this temperature sensing device enables this device to be installed in the CCD chip of the device, resulting in that a temperature of the CCD linear sensor 30 can be detected more accurately.

In the preferred embodiment as above, although the temperature sensing device 20 is installed on the CCD linear sensor 30, this is not limited to the installation on the CCD linear sensor 30, but it may be installed on either a CCD area sensor or a CCD delay line. In the case of the CCD delay sensor, for example, although a total amount of delay comprised of a delay amount determined by a certain clock and a delay amount of buffer is changed in response to a temperature, installing of the temperature sensing device 20 on the chip enables a temperature variation of the CCD delay line to be detected more accurately and concurrently a more precision delay amount can be attained by performing a fine adjustment of the delay amount.

In addition, this is not limited to the CCD, but the present invention can be executed in such a way that it can be installed on an amplifying type solid-state imaging device such as a MOS type image sensor or a BASIS (Base Stored Image Sensor) type image sensor and further a general type of semiconductor device such as MOS circuit or the like and a temperature changing amount in an output of a semiconductor device can be corrected in reference to the measured temperature information.

Figure 10:
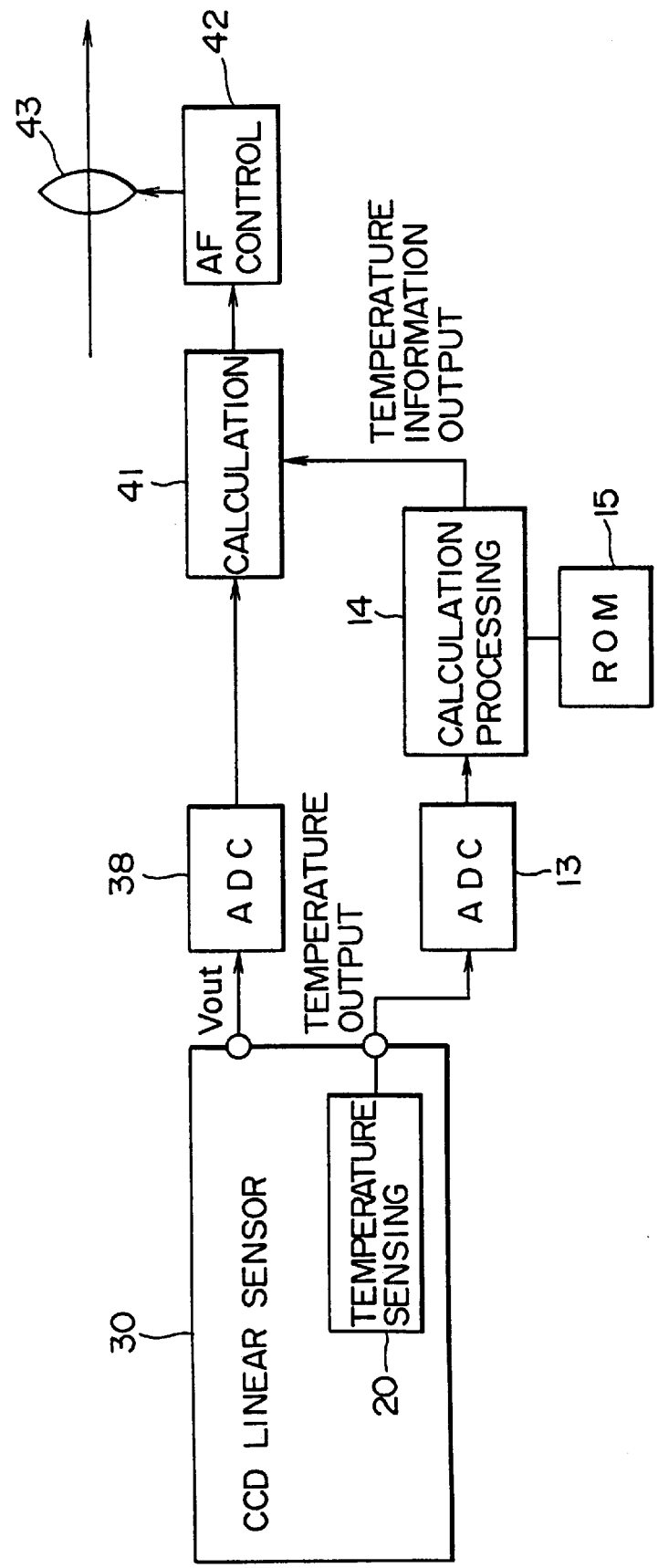
FIG. 10 is a schematic configuration view for showing an AF system in which th CCD linear sensor having the temperature sensing device of the present invention installed therein issued as an AF sensor.
Figure 11:
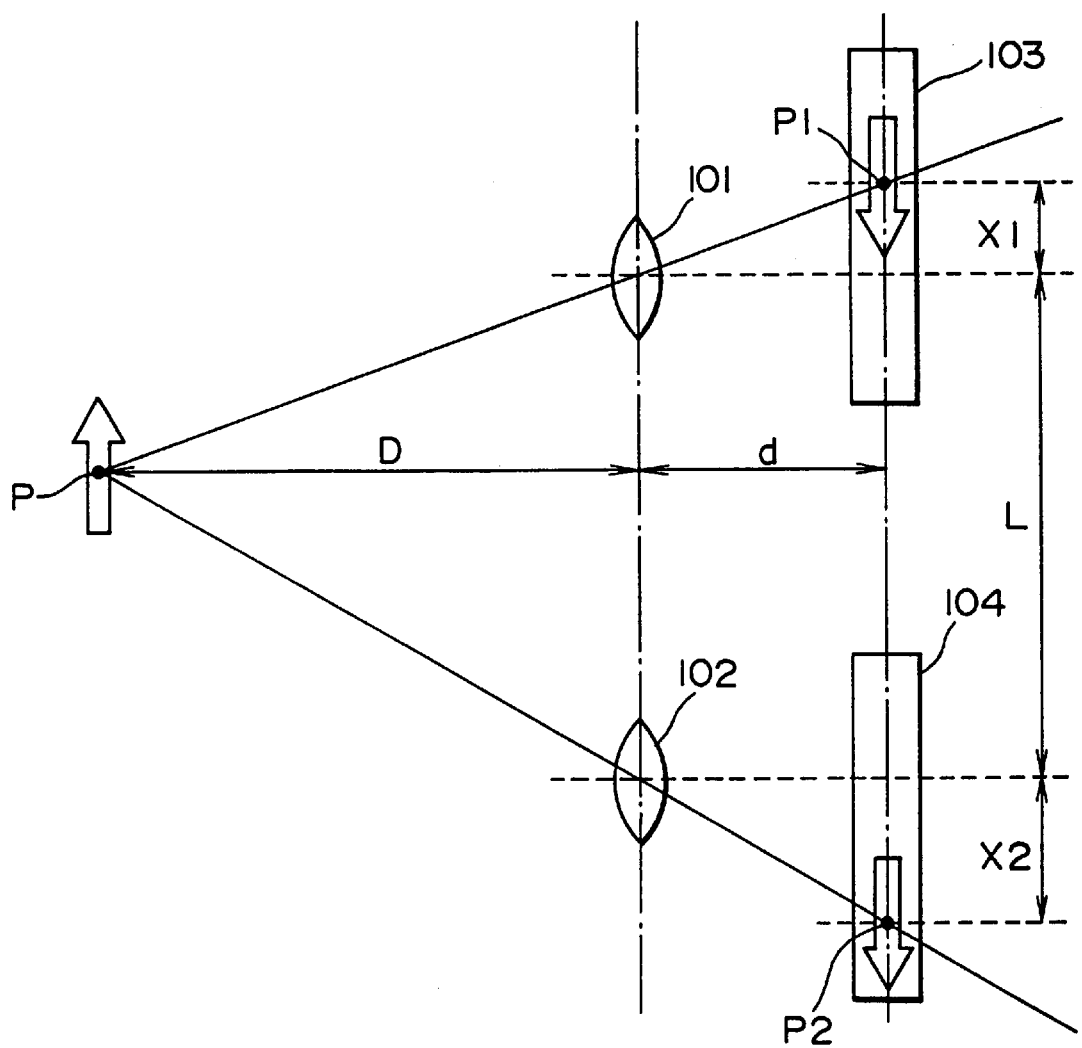
FIG. 11 is a view for showing a principle of auto-focusing operation.
Figure 12A:
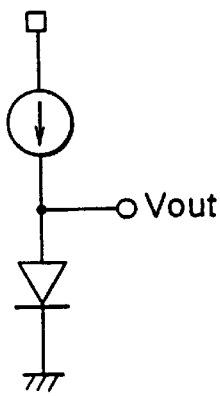
FIGS. 12A and 12B are circuit diagrams (No.1) for showing an example of the prior art.
Figure 12B:
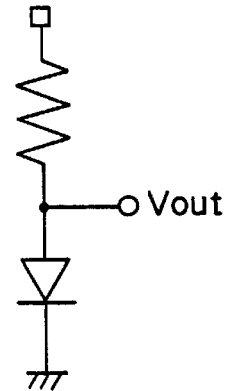
Figure 13A:
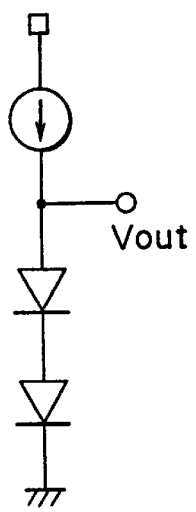
FIGS. 13A and 13B are circuit diagrams (No.2) for showing an example of the prior art.
Figure 13B:
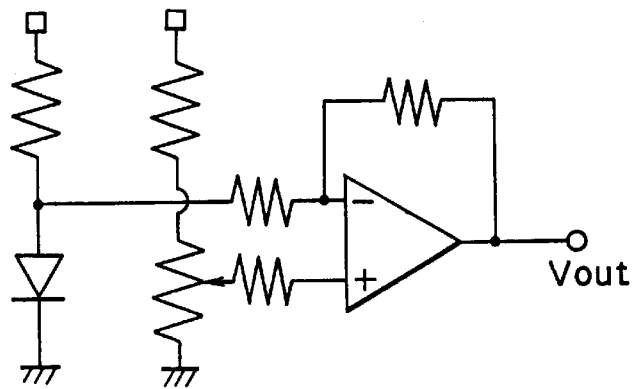

FIG. 10 is a schematic configuration view for showing one example of the AF system in which the CCD linear sensor having the temperature sensing device 20 of the present invention installed therein, for example, is used as the AF sensor. The same component parts in FIG. 10 as those of FIGS. 8 and 9 are applied with the same reference numbers. In FIG. 10, the output signal Vout of the CCD linear sensor 30 is changed into a digital form by the AD converter 38, thereafter this signal is supplied to a calculation circuit 41 comprised of a microcomputer. In FIG. 10, only one CCD linear sensor 30 is shown, although as apparent from an auto-focusing principle figure of FIG. 11, two CCD linear sensors are used for calculating an actual focusing displacement amount.

In turn, as already illustrated in FIG. 8, a temperature output from the temperature sensing device 20 installed on the CCD linear sensor 30 is changed into a digital form by the AD converter 13, thereafter an actual temperature is calculated in the calculation processing circuit 14 in reference to the table of temperature coefficients and output voltages stored in advance in the ROM 15 and then the calculated temperature is given to the calculation circuit 41 as an output of the temperature information.

In this calculation circuit 41, a focusing displacement amount is calculated in response to the output signal Vout of the CCD linear sensor 30 and concurrently the calculated focusing displacement amount is corrected in reference to the output of the temperature information from the calculation processing circuit 14. Then, the AF control circuit 42 performs a focusing adjustment by moving the lens 43 in an optical axis direction in response to the focusing displacement amount in which the temperature correction is attained.

As described above, the CCD linear sensor 30 having the temperature sensing device 20 installed on its chip is used as the AF sensor in the AF system to enable a temperature of the AF sensor by itself to be measured more accurately, so that it is possible to improve a correction accuracy for error caused by a strain (aberration) variation in an optical system of an applied lens or the like. Accordingly, a more accurate auto-focusing control can be attained.

As described above, in accordance with the present invention, the MOS transistor is used and a temperature is detected in reference to a varying amount of current in the MOS transistor having a temperature dependency while a potential in the case of depletion under a gate of the MOS transistor is being controlled to become equal to the reference voltage, thereby this temperature sensing device can be manufactured on the chip of the measured device in the MOS process, resulting in that a temperature variation of the measured device can be detected more accurately.

what is claimed is:

1. A temperature sensing device comprising:
    a potential control circuit having a first MOS transistor, said potential control circuit controlling a gate voltage of said first MOS transistor in response to a depletion potential created under said gate; and
    a temperature output circuit including a second MOS transistor of which a gate voltage is controlled by said potential control circuit, an output of said temperature output circuit being indicative of temperature.

2. A temperature sensing device as set forth in claim 1, wherein a current flowing in either a drain or a source of said second MOS transistor is applied as said temperature output.

3. A temperature sensing device as set forth in claim 1, wherein said temperature output circuit further includes a reference resistor connected in series with said second MOS transistor and a current flowing in either a drain or a source of said second MOS transistor is attained as a voltage output through said reference resistor and applied as said temperature output.

4. A temperature sensing device as set forth in claim 1, wherein said potential control circuit further includes a comparator circuit, wherein said comparator circuit compares said depletion potential with a reference voltage and controls said gate voltage of said first MOS transistor in such a way that said depletion potential is equal to said reference voltage or a potential proportional to said reference voltage.

5. A temperature sensing device as set forth in claim 1 further comprising:
    a memory with a table of temperature coefficients and output voltages in normal temperature stored thereon;
    an A/D converter for changing said temperature output into a digital form; and
    a calculation processing circuit for calculating an actual temperature from output data of said A/D converter as a temperature information output in reference to said table of temperature coefficients and output voltages in normal temperature stored in said memory.

6. A semiconductor device comprising:
    a potential control circuit having a first MOS transistor, said potential control circuit controlling a gate voltage of said first MOS transistor in response to a depletion potential created under said gate; and
    a temperature output circuit including a second MOS transistor of which a gate voltage is controlled by said potential control circuit, an output of said temperature output circuit being indicative of temperature, wherein said potential control circuit and said temperature output circuit are fabricated on the same chip.

7. A semiconductor device as set forth in claim 6, wherein said semiconductor device is a CCD.

8. A semiconductor device as set forth in claim 6, wherein said semiconductor device is selected from a MOS type image sensor, a BASIS type image sensor and a MOS circuit.

9. An auto-focusing system including a solid state imaging device applied as an auto-focusing sensor, said imaging device comprising:

a potential control circuit having a first MOS transistor, said potential control circuit controlling a gate voltage of said first MOS transistor in response to a depletion potential created under said gate; and a temperature output circuit including a second MOS transistor of which a gate voltage is controlled by said potential control circuit, an output of said temperature output circuit being indicative of temperature, wherein said potential control circuit and said output circuit are fabricated on the same chip as said imaging device.

10. An auto-focusing system as set forth in claims 9, further comprising:

a memory with a table of temperature coefficients and output voltages at a normal temperature stored thereon, a first calculation circuit for calculating a focusing displacement in response to an output signal of said solid-state imaging device, and a second calculation circuit for calculating an actual temperature from said temperature output as a temperature information output in reference to said table of temperature coefficients and output voltages at a normal temperature stored in said memory, wherein said focusing displacement amount is corrected in response to said temperature information output.

11. A temperature sensing device as set forth in claim 4, wherein said comparator circuit is comprised of NMOS transistors.

12. A temperature sensing device as set forth in claim 4, wherein said comparator circuit is comprised of PMOS transistors.

13. A semiconductor device as set forth in claim 6, wherein said potential control circuit further includes a comparator circuit, wherein said comparator circuit compares said depletion potential with a reference voltage and controls said gate voltage of said first MOS transistor in such a way that said depletion potential is equal to said reference voltage or a potential proportional to said reference voltage.

14. A semiconductor device as set forth in claim 13, wherein the reference voltage is made variable in response to a temperature.

15. An auto-focusing system as set forth in claim 9, wherein said potential control circuit further includes a comparator circuit, wherein said comparator circuit compares said depletion potential with a reference voltage and controls said gate voltage of said first MOS transistor in such a way that said depletion potential is equal to said reference voltage or a potential proportional to said reference voltage.

16. An auto-focusing system as set forth in claim 15, wherein the reference voltage is made variable in response to a temperature.

* * * * *

UNITED STATES PATENT AND TRADEMARK OFFICE
CERTIFICATE OF CORRECTION

PATENT NO. : 5,914,629
DATED : June 22, 1999
INVENTOR(S) : Yasuhito MAKI

It is certified that error appears in the above-identified patent and that said Letters Patent is hereby corrected as shown below:

Column 9, line 26, "claims" should read -- claim --.

Signed and Sealed this

Eighteenth Day of April, 2000

Attest:

Q. TODD DICKINSON

Attesting Officer

Director of Patents and Trademarks